United States Patent
Way

(10) Patent No.: US 7,804,724 B2
(45) Date of Patent: Sep. 28, 2010

(54) METHOD AND APPARATUS FOR BOUNDARY SCAN PROGRAMMING OF MEMORY DEVICES

(75) Inventor: Douglas Donald Way, Kanata (CA)

(73) Assignee: Alcatel Lucent, Paris (FR)

( * ) Notice: Subject to any disclaimer, the term of this patent is extended or adjusted under 35 U.S.C. 154(b) by 281 days.

(21) Appl. No.: 11/799,507

(22) Filed: May 2, 2007

(65) Prior Publication Data

US 2008/0272805 A1 Nov. 6, 2008

(51) Int. Cl.
 G11C 7/00 (2006.01)
(52) U.S. Cl. ............... 365/189.16; 326/39; 365/189.08; 365/189.2; 714/727
(58) Field of Classification Search .................... 326/38, 326/39, 41; 365/189.011, 189.08, 201, 189.16, 365/189.2; 714/727
See application file for complete search history.

(56) References Cited

U.S. PATENT DOCUMENTS

| | | | | |
|---|---|---|---|---|
| 5,325,368 | A * | 6/1994 | James et al. | 714/727 |
| 5,768,289 | A * | 6/1998 | James | 714/727 |
| 5,828,825 | A * | 10/1998 | Eskandari et al. | 714/27 |
| 5,872,793 | A * | 2/1999 | Attaway et al. | 714/726 |
| 6,937,493 | B2 * | 8/2005 | Krause et al. | 365/63 |
| 7,360,133 | B2 * | 4/2008 | Goyal et al. | 714/726 |
| 7,437,635 | B1 * | 10/2008 | Dang et al. | 714/726 |
| 7,536,616 | B2 * | 5/2009 | Reis et al. | 714/727 |
| 2003/0163773 | A1 * | 8/2003 | O'Brien et al. | 714/726 |

OTHER PUBLICATIONS

Intel, Introduction to On-Board Programming with Intel Flash Memory, Application Note, Nov. 1996, pp. 1-14, AP-624.
Intel, Simplify Manufacturing by Using Automatic-Test-Equipment for On-Board Programming, Application Note, Dec. 1998, pp. 1-15, AP-629.
Intel, Designing for On-Board Programming Using the IEEE 1149.1 (JTAG) Access Port, Application Note, Nov. 1996, pp. 1-14, AP-630.
Intel, Improving Programming Throughput of Automated Flash Memories, Application Note, Dec. 1998, pp. 1-22, AP-678.
Xilinx, Bscan_Virtex2, Virtex-II Boundary Scan Logic Control Circuit, Libraries Guide ISE 6.Ii, pp. 209-210.
Xilinx, Configuration and Readback of Virtex FPGAs Using (JTAG) Boundary Scan, Application Note: Virtex Series, Sep. 12, 2003, pp. 1-17.
JTAG-How Does the BSCAN_VIRTEX (BSCAN_SPARTAN2) Block, Answer Record #10703, Jan. 2, 2001, pp. 1-2.

* cited by examiner

*Primary Examiner*—Dang T Nguyen
*Assistant Examiner*—Alexander Sofocleous
(74) *Attorney, Agent, or Firm*—Ross D. Snyder & Associates, Inc.

(57) ABSTRACT

In accordance with at least one embodiment, a method, apparatus, and article of manufacture are provided for configuring a virtual boundary register in a programmable logic device (PLD), transmitting a first user-definable-command operation code (opcode) to the PLD to effect programming of a memory device coupled to the PLD, and preferably transmitting a second user-definable-command opcode to the PLD, the second user-definable-command opcode causing the physical boundary scan circuitry to load the virtual boundary register. The foregoing is preferably achieved in accordance with a boundary scan standard (e.g., Institute of Electrical and Electronics Engineers, Inc. (IEEE) 1149.1, dated 2001).

29 Claims, 9 Drawing Sheets

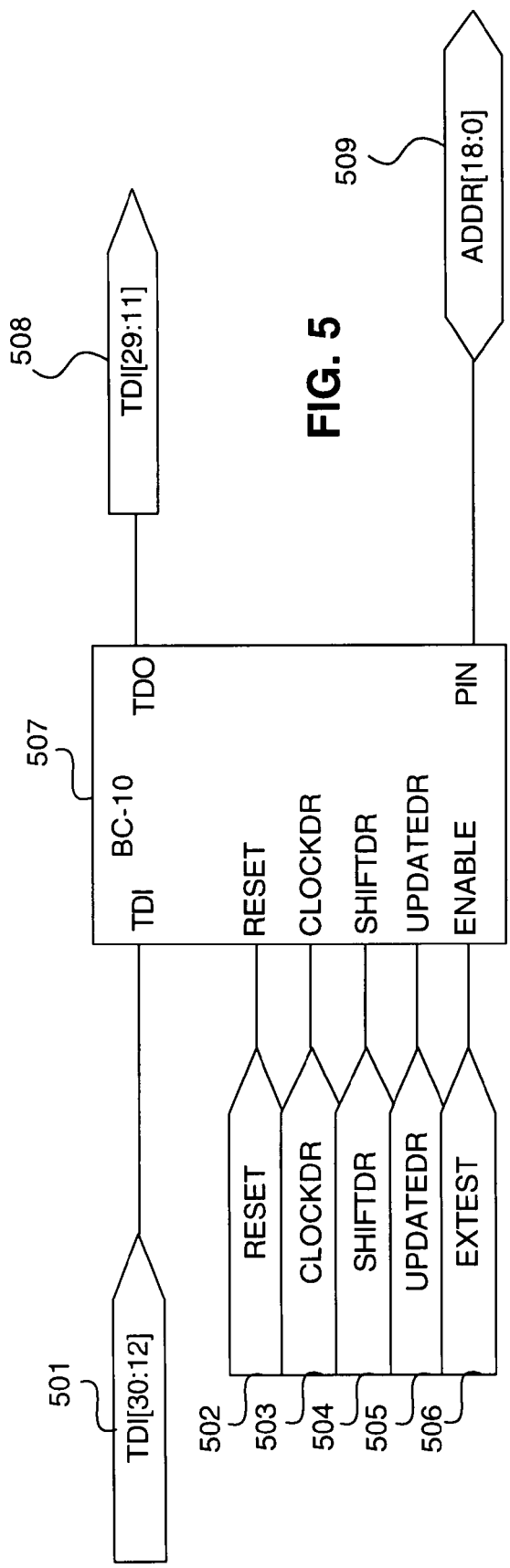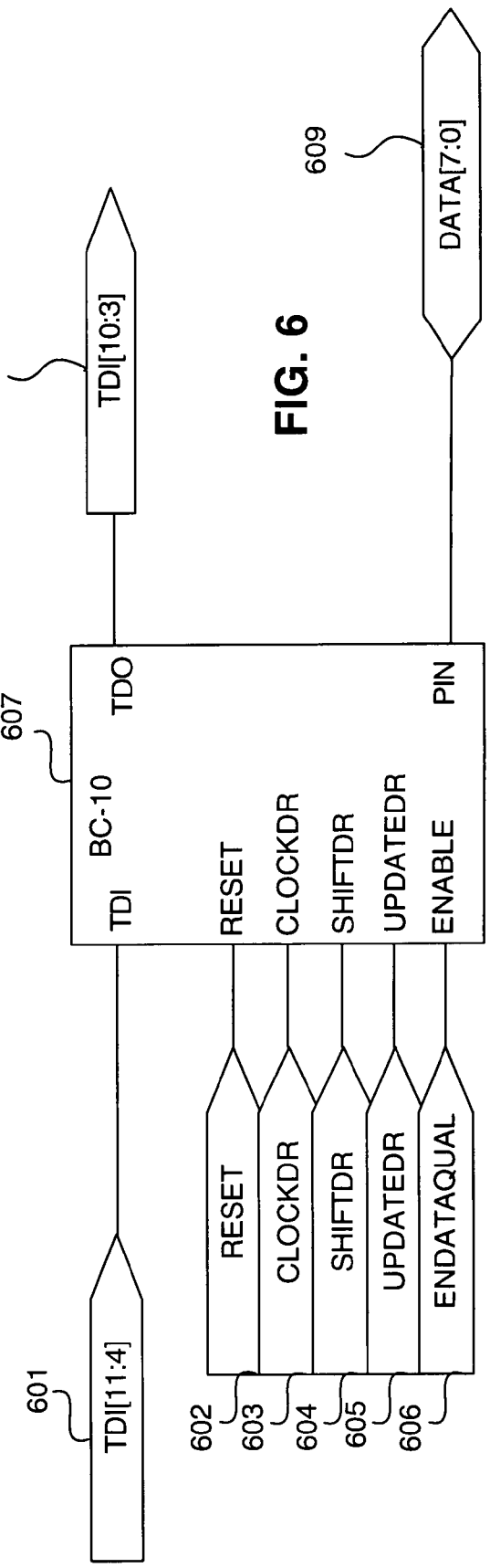

METHOD AND APPARATUS FOR BOUNDARY SCAN PROGRAMMING OF MEMORY DEVICES

BACKGROUND OF THE INVENTION (1) Field of the Invention

The invention relates to programmable devices and, more particularly, to rapidly programming programmable devices.

(2) Description of the Related Art

In high performance circuit cards, memory devices (e.g., flash memory devices), such as those used to store boot loads, are often installed unprogrammed into a circuit card and then programmed later using resources on the card such as special development processor ports or boundary scan circuitry. This is done because device packages used in such circuit card applications do not lend themselves to be easily socketed, and therefore off-board programming is difficult. Of these two methods of memory device programming, namely programming via special processor ports and programming via boundary scan circuitry, using boundary scan circuitry is more convenient based on the greater availability of commercially available tools and services for this method compared to using processor development ports.

Certain tools that use boundary scan for programming, particularly FIRECRON's flash boundary scan programming software, can significantly reduce flash programming time. However, FIRECRON's software requires the use of four additional I/O pins on the programmable logic device to create a second test access port (TAP) and additional circuits on the circuit card to support the port. Since it is desirable in high performance circuit cards to achieve the most efficient use of space for cost and performance reasons, a technique for achieving reduced flash programming times without the need of a second TAP and supporting circuitry is desired.

BRIEF DESCRIPTION OF THE SEVERAL VIEWS OF THE DRAWINGS

The present invention may be better understood, and its features made apparent to those skilled in the art by referencing the accompanying drawings.

FIG. 5 is a block diagram illustrating a boundary scan register for an address bus in accordance with at least one embodiment.

FIG. 6 is a block diagram illustrating a boundary scan register for a data bus in accordance with at least one embodiment.

The use of the same reference symbols in different drawings indicates similar or identical items.

DETAILED DESCRIPTION OF THE INVENTION

Figure 1:
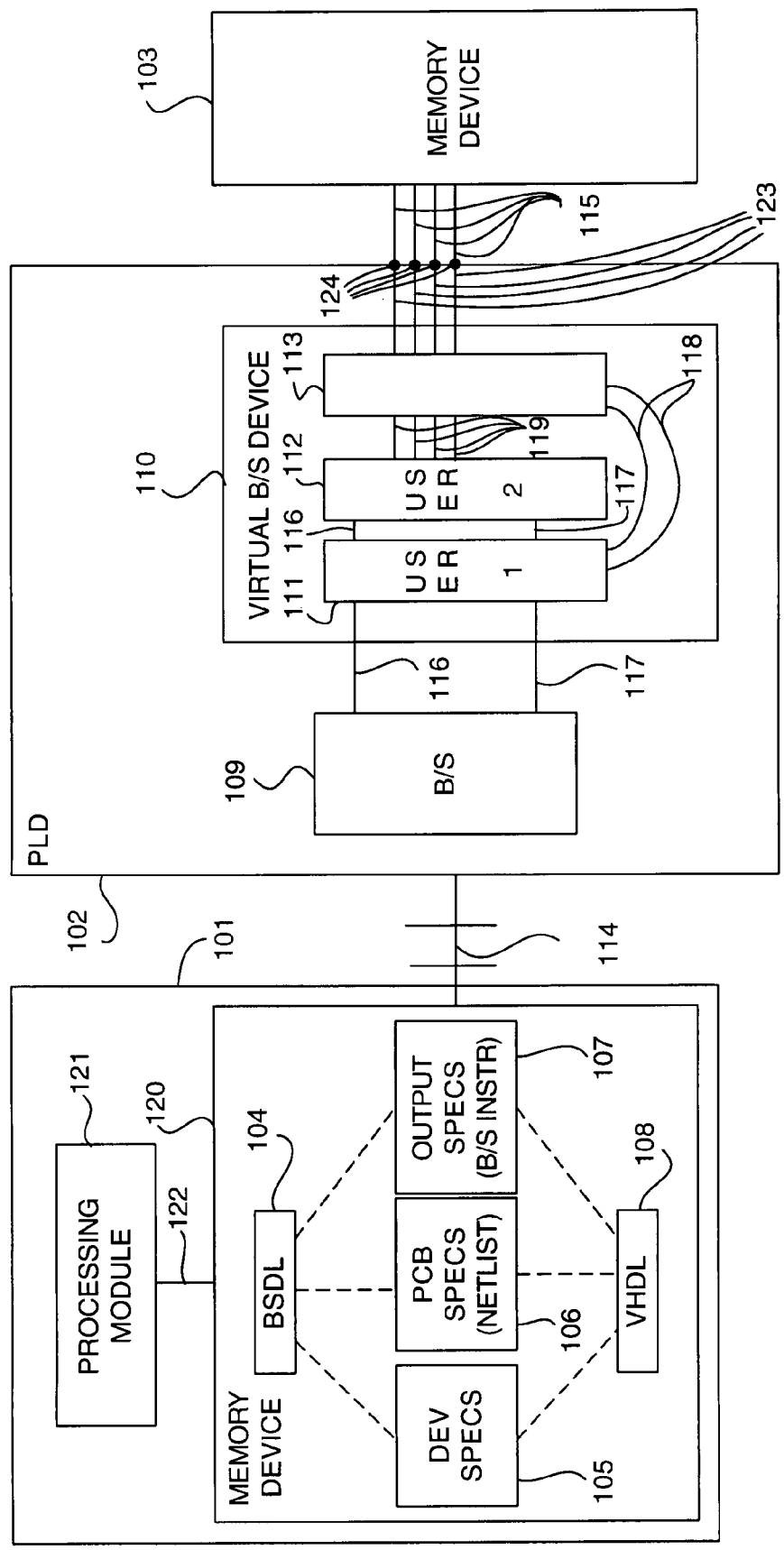
FIG. 1 is a block diagram illustrating a system in accordance with at least one embodiment.

In accordance with at least one embodiment, a method, apparatus, and article of manufacture are provided for configuring a virtual boundary register in a programmable logic device (PLD) (e.g., a field-programmable logic array (FPGA)), transmitting a first user-definable-command operation code (opcode) to the PLD to effect programming of a memory device coupled to the PLD, and preferably transmitting a second user-definable-command opcode to the PLD, the second user-definable-command opcode causing the physical boundary scan circuitry to load the virtual boundary register. The foregoing is preferably achieved in accordance with a boundary scan standard (e.g., Institute of Electrical and Electronics Engineers, Inc. (IEEE) 1149.1, dated 2001).

According to the at least one embodiment, a method and apparatus for loading a pseudo boundary scan register without the need of a second test access port (TAP) is provided. Such a method and apparatus is compatible with the latest version of the IEEE boundary scan standard (i.e., IEEE 1149.1 dated 2001). According to the new version of the standard, an already existing instruction known as EXTEST is now allowed to be non-zero. In accordance with at least one embodiment, a first one of two already supported user-specific instructions (e.g., USER1) is defined as the EXTEST instruction, which is also defined to have a non-zero value that selects the pseudo boundary register used to program the flash. The second one of the two user-specific instructions (e.g., USER2) is defined as a SAMPLE/PRELOAD instruction that is used to load the pseudo boundary register. Since these instructions are supported by the standard, conventional standard compliant boundary scan tools can be used to load the pseudo boundary register, and, thereafter, program the flash.

Compared to programming using traditional boundary scan, at least one embodiment may be used to reduce the programming time by at least an order of magnitude. In one exemplary instance, the programming time was reduced from 21 minutes to 1.5 minutes. Compared to a known technique (FIRECRON), the main advantage is that the second TAP and supporting circuitry is not required by the present invention, which results in increased circuit card space for other functions.

At least one embodiment is useful and may be implemented in electronic circuit card manufacturing, in telecom, in computing, and in other fields. Many circuit cards utilize firmware stored in a non-volatile memory device, for example, a flash memory device. The circuit cards boot load the firmware from the memory device during initialization. Therefore, non-volatile memory devices (e.g., flash devices) are widely used and must be programmed with the firmware. Reducing the time taken to perform manufacturing steps, such as programming memory devices, is important to reduce the cost of circuit card assemblies. Therefore, at least one embodiment is applicable to reducing manufacturing costs across a wide range of electronic equipment manufacturers including communication equipment manufacturers.

In accordance with at least one embodiment of the present invention, a field programmable gate array (FPGA) is coupled to a non-volatile memory device by a plurality of connections. As it is often desirable to program the non-volatile memory device after it has already been connected to the FPGA (e.g., when installed on a circuit board), the FPGA may be configured to facilitate programming of the memory device. Implementing a pseudo boundary scan device in the FPGA can allow boundary scan tools to be used to access the pseudo boundary scan device, and the FPGA can communicate with the memory device to program the memory device. By utilizing user-programmable boundary scan instructions to denote instructions for the pseudo boundary scan device to perform, the need for providing an additional test access port (TAP) for the pseudo boundary scan device can be avoided. Accordingly, the number of connections to the FPGA can be minimized, and the need for external parts to implement the TAP for the pseudo boundary scan device can be avoided. Moreover, by removing complexity of the additional TAP for the pseudo boundary scan device, the boundary scan chain length for accessing the pseudo boundary scan device can be reduced, thereby improving the rate at which a memory device can be programmed using the pseudo boundary scan device and decreasing the programming time.

The time involved in programming a memory device using boundary scan techniques depends on the number of memory locations that need to be programmed, the clock frequency utilized, the number of scans required to program a single memory location, and the boundary scan register length. The number of memory locations to be programmed can be reduced by optimizing the information (e.g., instruction code) being programmed, but, for a given level of functionality to be provided by the information, the information, even when fully optimized, will still require a minimum number of memory locations.

One way to further reduce that minimum number of memory locations is to program a memory device with a smaller amount of information to provide a more limited range of functionality (e.g., instruction code that implements testing only and not normal system operation). The memory device can be quickly programmed, and the memory device and/or the system comprising the memory device can be quickly tested using the smaller amount of information. Then, if the memory device and/or system satisfies testing criteria, more comprehensive information (e.g., instruction code that supports full functionality for normal system operation) can be programmed into the memory device. As the more comprehensive information will still require programming time in proportion to the larger amount of the more comprehensive information, the programming time savings obtained by first programming the smaller amount of information are typically realized only for memory devices and/or systems that fail to satisfy the testing criteria. However, as larger memory devices are more expensive, it may well be economical to utilize a memory device that is large enough to store instruction code that supports full functionality for normal system operation, but not necessarily large enough to store instruction code to implement testing.

The clock frequency used to implement boundary scan programming is limited by the boundary scan chain design. To increase the clock frequency to reduce programming times, constraints in the boundary scan chain that limit the clock frequency should be removed. By configuring a pseudo boundary scan register that can be accessed without having to add a second boundary scan test access port, many of such constraints can be avoided.

The number of scans required to program a single location depend on several factors. The number of write cycles needed to program each location depends on the design of the memory device. The number of scans per write cycle depends on the design of the circuit board on which the memory device is located. For example, a circuit board may be designed to control a write enable (WE) input of the memory device using a bit of a boundary scan register or using a discrete input line separate from the boundary scan registers.

The boundary scan register length is the number of cells (e.g., the number of bits) of sequential logic between a TDI and a TDO to which a boundary scan tool can access the boundary scan chain. The boundary scan register length depends on the boundary scan chain design. In at least some cases, the boundary scan register length can be changed. For example, devices in a boundary scan chain may be configured to be in a bypass and/or high-impedance (BYPASS/HIGHZ) mode unless they are involved in the boundary scan operation being performed, such as boundary scan programming of a memory device. As another example, the number of boundary scan devices to which a memory device is coupled can be limited (e.g., the memory device can be coupled directly to a single boundary scan device in at least some cases).

By configuring a pseudo boundary scan device having a pseudo boundary scan register in a PLD coupled to a memory device to be programmed and utilizing a single boundary scan TAP of the PLD to access the pseudo boundary scan device, the boundary scan register length can be minimized to a length sufficient to allow programming of the memory device and constraints that might otherwise be imposed on the clock frequency can be avoided. Accordingly, the programming time for programming a given amount of data (e.g., instruction code) into a given type of memory device can be minimized.

To implement memory device programming using a reduced length boundary scan register via a single standard TAP, several elements may be implemented. For example, a boundary scan logic control circuit, a simplified BC-10 cell (e.g., a logic cell comprising an input, two latches, and an output) with output driver, and a boundary register for providing communication with the memory device for an address bus, a data bus, and control signals may be implemented. Such elements may be used with a boundary scan tool. The boundary scan tool can interface with a circuit board comprising such elements and can include a processing module and memory, wherein the memory comprises operating instructions (e.g., a boundary scan description language (BSDL) file) to cause the processing module to interact with the circuit board so as to effect programming of a memory device.

As boundary scan elements are typically implemented in integrated circuit devices, a standard TAP comprising several electrical connections (e.g., pins) and a TAP controller to process signals provided via such electrical connections are typically provided within such a device. However, reliance solely on such boundary scan elements can lead to excessively long boundary register lengths, which can increase programming times for programming memory devices via such boundary scan elements. While the implementation and use of a pseudo boundary scan device can minimize boundary register length, standard boundary scan instructions are not typically defined to address a pseudo boundary scan device. However, more recently defined standard boundary scan instructions do comprise user-definable instructions (e.g., USER1 and USER2). Such user-definable instructions may be used to access a register defined in core logic of a PLD. By defining a pseudo boundary register in core logic of a PLD and defining user-definable boundary scan instructions to represent boundary scan instructions to access the pseudo boundary register (e.g., defining USER1 and/or USER2 user-definable boundary scan instructions to represent EXTEST and/or SAMPLE/PRELOAD boundary scan instructions for accessing the pseudo boundary register), a minimal boundary scan register length can be provided to minimize programming time without the need for implementing an additional TAP for the pseudo boundary register, thereby avoiding the need for the use of additional electrical connections and additional circuitry to implement an additional TAP for the pseudo boundary register.

The SAMPLE/PRELOAD instruction is referred to as a single instruction, as it may be implemented using a single opcode and may be used either to sample data or to preload data into a register. As the EXTEST and SAMPLE/PRELOAD boundary scan instructions are compatible with boundary scan tools for programming memory devices via boundary scan circuitry, defining the USER1 and USER2 user-definable boundary scan instructions to represent the EXTEST and SAMPLE/PRELOAD boundary scan instructions provides compatibility with existing boundary scan tools for programming memory devices but also provides the ability to minimize programming time by optimizing boundary scan register length. Moreover, as the USER1 and USER2 user-definable boundary scan instructions provide access to a register that may be defined in a PLD, and a register may be defined in a PLD so as to provide inputs, outputs, and/or bidirectional inputs/outputs at electrical connections (e.g., pins) of the PLD, implementing such a register definition, along with defining the USER1 and USER2 user-definable boundary scan instructions to represent the EXTEST and SAMPLE/PRELOAD boundary scan instructions allows existing boundary scan tools for programming memory devices to access a preferably optimally defined pseudo boundary scan register in the PLD so as to effect programming of the memory device in a minimal amount of time.

If other boundary scan devices are present in a boundary scan chain on a circuit board along with the PLD, they may be effectively removed from the boundary scan chain by placing them in a boundary scan bypass mode by issuing to them a boundary scan BYPASS instruction. Bypassing such other devices prevents them from increasing the boundary scan register length and imposing delays that would increase programming time.

In accordance with at least one embodiment, only electrical connections (e.g., pins) of the PLD connected to the memory device to be programmed need be defined for the purpose of programming the memory device. One self-monitoring output cell may be defined for each of such electrical connections. A direction of a data bus coupling the PLD to the memory device may be controlled by one cell (e.g., the data bus may be implemented bidirectionally, with one cell of the PLD defined to control the direction of the data bus (e.g., from the PLD to the memory device for writing data to the memory device or from the memory device to the PLD for reading data from the memory device)).

A boundary scan description language (BSDL) file is provided to describe the pseudo boundary scan device. The BSDL file defines the user-definable boundary scan instructions to represent boundary scan instructions for accessing the pseudo boundary scan device. The BSDL file redefines the boundary register to be the pseudo boundary register of the pseudo boundary scan device. The BSDL file reduces the port listing for the TAP to the minimal set of pins used to access the pseudo boundary scan device.

A net list specifying electrical connections to be implemented on a circuit board is modified to couple the pseudo boundary scan device implemented on the PLD to the memory device to be programmed. If a memory device to be programmed is coupled to multiple programmable logic devices, none of which has access to all of the electrical connections (e.g., pins) of the memory device used for programming the memory device, several of the multiple programmable logic devices may be used to implement an embodiment among enough programmable logic devices to be able to access all relevant electrical connections of the memory device to be programmed. Such an implementation can yield substantial reductions in programming time, as configuration of a pseudo boundary scan register length of preferably optimal length avoids the need for the boundary scan register length to be the sum of the lengths of the native physical boundary scan registers of the several programmable logic devices, which can be quite long. Electrical connections defined for the PLD are duplicated, for example, with the duplicates designated as electrical connections for effecting programming of the memory device.

A PLD can be programmed to implement a pseudo boundary scan register using any method typically used to program PLDs. For example, a PLD may be programmed using a boundary scan tool and boundary scan circuitry of the PLD. As another example, a configuration programmable read-only memory (PROM) circuit may be programmed, for example, via boundary scan circuitry, and the configuration PROM circuit may be used to program the PLD, for example, during system power-up.

FIG. 1 is a block diagram illustrating a system in accordance with at least one embodiment. The system comprises a boundary scan tool 101, a programmable logic device (PLD) 102, and a memory device 103. Memory device 103 is preferably a flash memory device. Boundary scan tool 101 comprises processing module 121 and memory device 120. Processing module 121 is coupled to memory device 120 via coupling 122. Memory device 120 comprises operating instructions corresponding to boundary scan description language (BSDL) description 104, device specifications 105, printed circuit board (PCB) specifications (netlist) 106, output specifications (boundary scan instructions) 107, and very high speed integrated circuit hardware description language (VHDL) 108. PLD 102 comprises boundary scan circuitry 109 and virtual boundary scan device 110. Virtual boundary scan device 110 comprises user-programmable instruction interpreter 111, user-programmable instruction interpreter 112, and interface 113.

Boundary scan tool 101 is coupled to PLD 102 via couplings 114. Interface 113 of virtual boundary scan device 110 of PLD 102 is coupled via couplings 123 to electrical connections 124 of PLD 102, which are coupled to memory device 103 via couplings 115. Boundary scan circuitry 109 is coupled to virtual boundary scan device 110 via couplings 116 and 117. User-programmable instruction interpreter 111 is coupled to interface 113 via couplings 118. User-programmable instruction interpreter 112 is coupled to interface 113 via couplings 119.

At least one embodiment may be implemented as an article of manufacture comprising boundary scan tool 101, which comprises processing module 121 and memory device 120. Processing module 121 is coupled to memory device 120 via coupling 122. Memory device 120 is adapted to be read by processing module 121. Memory device 120 stores operating instructions for causing the processing module 121 to perform several functions, including configuring a virtual boundary register (e.g., virtual boundary scan device 110) in a programmable logic device (PLD) (e.g., PLD 102) and transmitting a first user-definable-command operation code (opcode) (e.g., USER1 opcode or, alternatively, USER2 opcode) to the PLD to effect programming of a memory device (e.g., memory device 103) coupled to the PLD.

Figure 2:
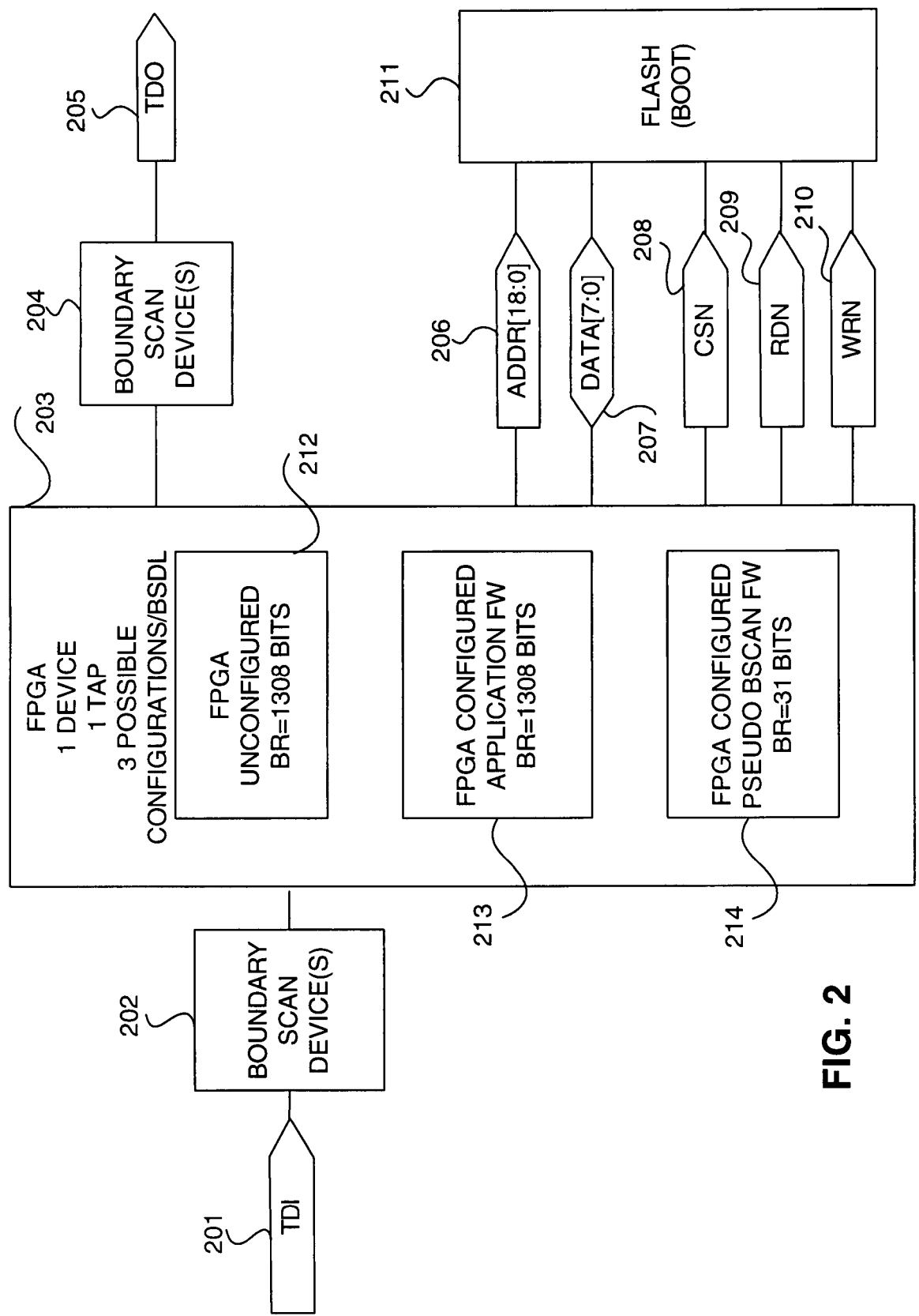
FIG. 2 is a block diagram illustrating a system comprising a pseudo boundary scan device in accordance with at least one embodiment.

The operating instructions of the article of manufacture optionally may comprise operating instructions for causing the processing module to perform establishing logical paths (e.g., couplings 123) from a plurality of cells (e.g., interface 113) of the virtual boundary register to electrical connections (e.g., pins) (e.g., electrical connections 124) of the PLD coupled to a data bus (e.g., data bus 207 of FIG. 2), an address bus (e.g., address bus 206 of FIG. 2), and control lines (e.g., CSN output 208, RDN output 209, and/or WRN output 210 of FIG. 2) (e.g., collectively, couplings 115) of the memory device. The operating instructions of the article of manufacture optionally may comprise operating instructions for causing the processing module to perform using the first user-definable-command opcode to cause physical boundary scan circuitry (e.g., boundary scan circuitry 109) of the PLD to provide access to the virtual boundary register. The operating instructions of the article of manufacture optionally may comprise operating instructions for causing the processing module to perform transmitting a second user-definable-command opcode to the PLD, the second user-definable-command opcode (e.g., USER2 opcode or, alternatively, USER1 opcode) causing the physical boundary scan circuitry to load the virtual boundary register.

The operating instructions of the article of manufacture optionally may comprise operating instructions for causing the processing module to perform using the first user-definable-command opcode to cause the PLD to transmit data to the memory device. The operating instructions of the article of manufacture optionally may comprise operating instructions for causing the processing module to perform translating an EXTEST command into the first user-definable-command opcode. The operating instructions of the article of manufacture optionally may comprise operating instructions for causing the processing module to perform translating a PRELOAD command into the second user-definable-command opcode. The operating instructions of the article of manufacture optionally may comprise operating instructions for causing the processing module to perform translating a SAMPLE command into the second user-definable-command opcode.

Optionally, the memory device is a non-volatile memory device. Optionally, the memory device is external to the PLD. Optionally, the memory device is a flash memory device.

FIGS. 2 through 8 provide more implementation detail in accordance with at least one embodiment. Similarly identified inputs and outputs may be coupled among the figures. For example, output CLOCKDR 311 is preferably provided to CLOCKDR inputs 403, 503, 603, 703, and 803. Inputs and outputs bearing similar nomenclature followed by a number or range of numbers enclosed in square brackets indicate specific instances among multiple instances of such inputs and outputs. For example, TDI[29:11] refers to instances 29 through 11 of TDI, wherein each instance is preferably one bit (e.g., one signal line) wide. Nomenclature followed by the letter N enclosed in square brackets indicates the implementation of an instance of the denoted signal line (and its corresponding circuitry) for each instance of similar nomenclature. For example, TDI[N] refers to an instance of the denoted signal line for each instance of TDI, where TDI may include a range of instances of TDI, for example, TDI[30:0]. For example, TDI[30:0] may represent 31 successively coupled one-bit registers of a 31-bit pseudo boundary scan register defined in the PLD. An element of data that is to appear at any of TDI[30:0] may be clocked through the boundary scan register chain in sequence with other elements of data that are to appear at others of TDI[30:0] until each element of data is situated at its desired TDI instance.

FIG. 2 is a block diagram illustrating a system comprising a pseudo boundary scan device in accordance with at least one embodiment. The system comprises boundary scan device 202, field programmable gate array (FPGA) 203, boundary scan device 204, and memory device 211. Test data input (TDI) 201 is coupled to boundary scan device 202. Boundary scan device 202 may comprise one or more boundary scan devices, for example, a plurality of boundary scan devices coupled to one another in a boundary scan chain, wherein the test data output (TDO) of one boundary scan device is coupled to the test data input (TDI) of the next boundary scan device. Boundary scan device 202 is coupled to FPGA 203, for example, with the TDO of boundary scan device 202 coupled to an input of FPGA 203 designated as a TDI.

FPGA 203 alternately comprises FPGA unconfigured boundary register 212 comprising, for example, 1308 bits of data storage; FPGA configured application firmware boundary register 213 comprising, for example, 1308 bits of data storage; or FPGA configured pseudo boundary scan firmware boundary register 214 comprising, for example, 31 bits of data storage. When FPGA 203 is in an unconfigured state, its native boundary scan architecture comprises FPGA unconfigured boundary register 212, comprising, for example, 1308 bits of data storage. When FPGA 203 is configured for normal use with application firmware programmed in a memory device, FPGA 203 comprises FPGA configured application firmware boundary register 213 comprising, for example, 1308 bits of data storage. When FPGA 203 is configured as a pseudo boundary scan device for programming the memory device, FPGA 203 comprises FPGA configured pseudo boundary scan firmware boundary register 214 comprising a minimal number of bits of data storage to provide programming of the memory device (e.g., 31 bits of data storage).

As FPGA configured pseudo boundary scan firmware boundary register 214 can provide a much smaller boundary scan register length than FPGA unconfigured boundary register 212 and FPGA configured application firmware boundary register 213, FPGA configured pseudo boundary scan firmware boundary register 214 can be used to program a memory device much more quickly than would otherwise be possible. For example, for a 1308-bit boundary scan register length, it has been found, according to one empirical example, to take nine seconds to erase a memory device, 1285 seconds to program the memory device, and 146 seconds to verify the memory device. However, for a 31-bit pseudo boundary scan register length, it has been found, according to an empirical example, to take nine seconds to erase the same memory device, 84 seconds to program the memory device, and 11 seconds to verify the memory device. Accordingly, the reduced length of the pseudo boundary scan register provides much faster programming times.

An output of FPGA 203 configured as a TDO is coupled to a TDI input of boundary scan device 204. Boundary scan device 204 may comprise one or more boundary scan devices, for example, a plurality of boundary scan devices coupled to one another in a boundary scan chain, wherein the TDO of one boundary scan device is coupled to the TDI of the next boundary scan device. Boundary scan device 204 provides TDO 205.

FPGA 203 provides a plurality of outputs, for example, a 19-bit parallel bus, configured as an address bus 206 and coupled to memory device 211. FPGA 203 provides a plurality of bidirectional inputs/outputs, for example, an eight-bit parallel bus, configured as a data bus 207 and coupled to memory device 211. FPGA 203 provides CSN output 208 to a chip select control input of memory device 211. FPGA 203 provides a RDN output 209 to a read control input of memory device 211. FPGA 203 provides a WRN output 210 to a write control input of memory device 211.

Figure 3:
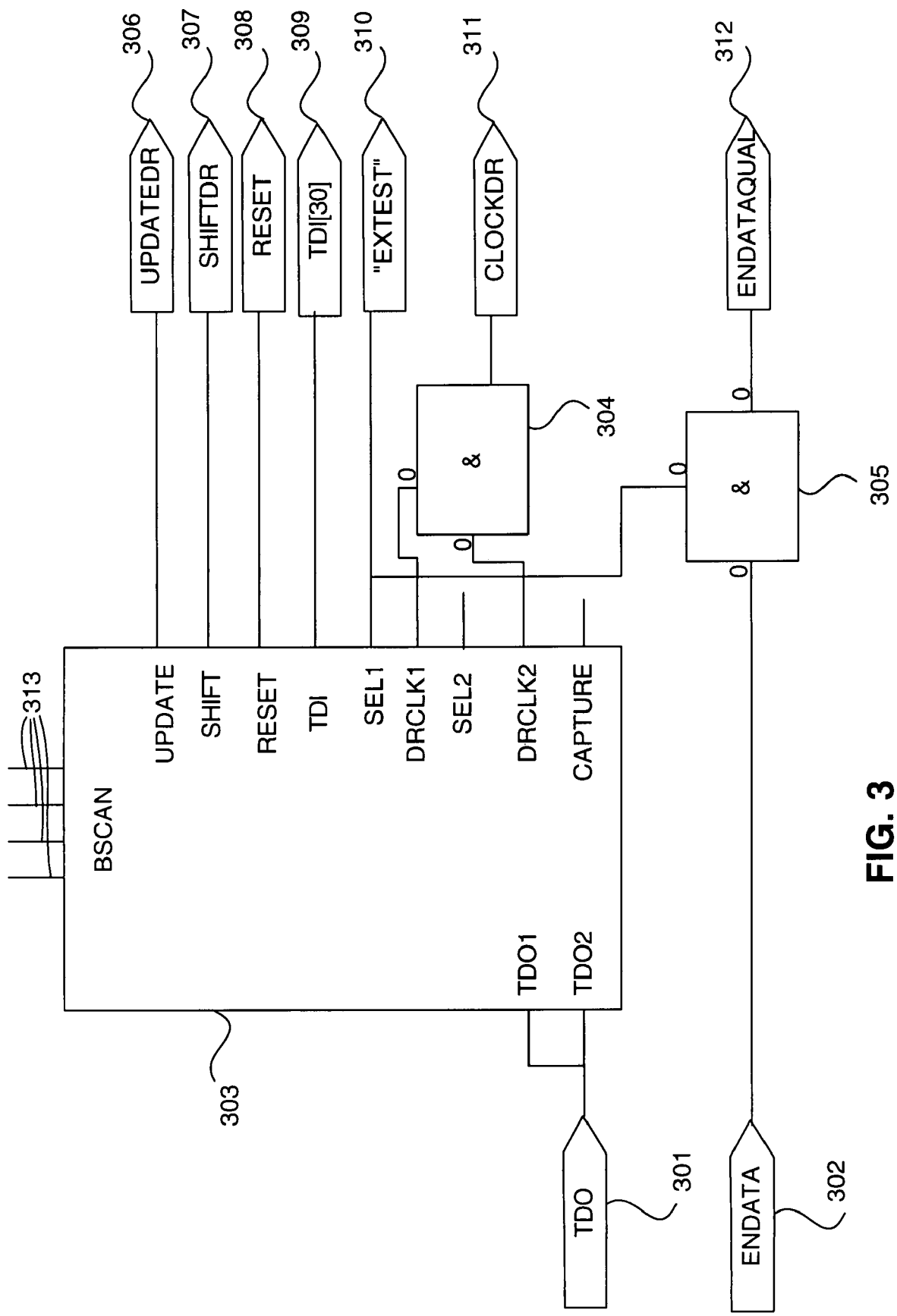
FIG. 3 is a block diagram illustrating a boundary scan logic control circuit in accordance with at least one embodiment.

FIG. 3 is a block diagram illustrating a boundary scan logic control circuit in accordance with at least one embodiment. The boundary scan logic control circuit comprises boundary scan register 303, logic gate 304 (e.g., an AND gate), and logic gate 305 (e.g., an AND gate). Boundary scan register 303 is coupled to hardware interface 313, which may, for example, be a dedicated hardware boundary scan TAP (i.e., not merely user-programmable general-purpose electrical connections of a PLD that happen to be programmed to function as a boundary scan TAP (e.g., pseudo boundary scan TAP)). Boundary scan register 303 can, for example, communicate with a boundary scan tool via hardware interface 313. Boundary scan register 303 receives TDO input 301, for example, from a TDO of another boundary scan device, at one or more inputs, such as inputs TDO1 and TDO2. Boundary scan register 303 provides an update output as clock output UPDATEDR 306, a shift output as output SHIFTDR 307, a reset output as output RESET 308, a TDI output as TDI[30] 309, and a select output from output SEL1 as output EXTEST 310.

An input ENDATA 302 is provided to a first input of logic gate 305 (e.g., an AND gate). The select output from output SEL1 is also provided a second input of logic gate 305. Logic gate 305 performs a logical operation (e.g., an AND operation) on the first and second inputs and provides an output as output ENDATAQUAL 312.

Boundary scan register 303 provides a clock output from output DRCLK1 to a first input of logic gate 306 (e.g., an AND gate). Boundary scan 303 provides a clock output from output DRCLK2 to a second input of logic gate 306. Logic gate 306 performs a logical operation (e.g., an AND operation) on the first and second inputs and provides an output as output CLOCKDR 311.

The output SEL1 of boundary scan register 303 can, for example, be considered a "USER1/not USER2" output, as it may exhibit positive logic (e.g., a logical "1") to represent a USER1 user-definable boundary scan instruction and negative logic (e.g., a logical "0") to represent a USER2 user-definable boundary scan instruction. The output SEL2 of boundary scan register 303 can, for example, be considered a "USER2/not USER1" output, as it may exhibit positive logic (e.g., a logical "1") to represent a USER2 user-definable boundary scan instruction and negative logic (e.g., a logical "1") to represent a USER1 user-definable boundary scan instruction. As another example, the above described functionality of output SEL1 and SEL2 may be reversed from the description above. Boundary scan register 303 may optionally provide an output CAPTURE, as illustrated.

The boundary scan logic control circuit of FIG. 3 may be implemented in accordance with the following PLD specification:

```
-- Component Declaration for BSCAN_VIRTEX2
component BSCAN_VIRTEX2 port (
    TDO1    : in std_logic;
    TDO2    : in std_logic;
    UPDATE  : out std_logic;
    SHIFT   : out std_logic;
    CAPTURE : out std_logic;
    RESET   : out std_logic;
    TDI     : out std_logic;
    SEL1    : out std_logic;
    DRCK1   : out std_logic;    -- normally HIGH
    SEL2    : out std_logic;
    DRCK2   : out std_logic;    -- normally HIGH
end component;
-- Component Instantiation for BSCAN_VIRTEX2
```

```
-continued

BSCAN : BSCAN_VIRTEX2 port map (
    DRCK1     => CK1,
    DRCK2     => CK2,
    RESET     => Reset,
    SEL1      => Extest,      -- Extest
    SEL2      => Sample,      -- Sample / Preload
    SHIFT     => ShiftDR,
    TDI       => Tdi(30),
    UPDATE    => UpdateDR,
    CAPTURE   => open,
    TDO1      => Tdo
    TDO2      => Tdo
    );
EnDataQual  <= Extest and      -- Data Bus output enable
               EnData;
ClkDR       <= CK1 and         -- CK1 / CK2 normally
               CK2;              high
```

Figure 4:
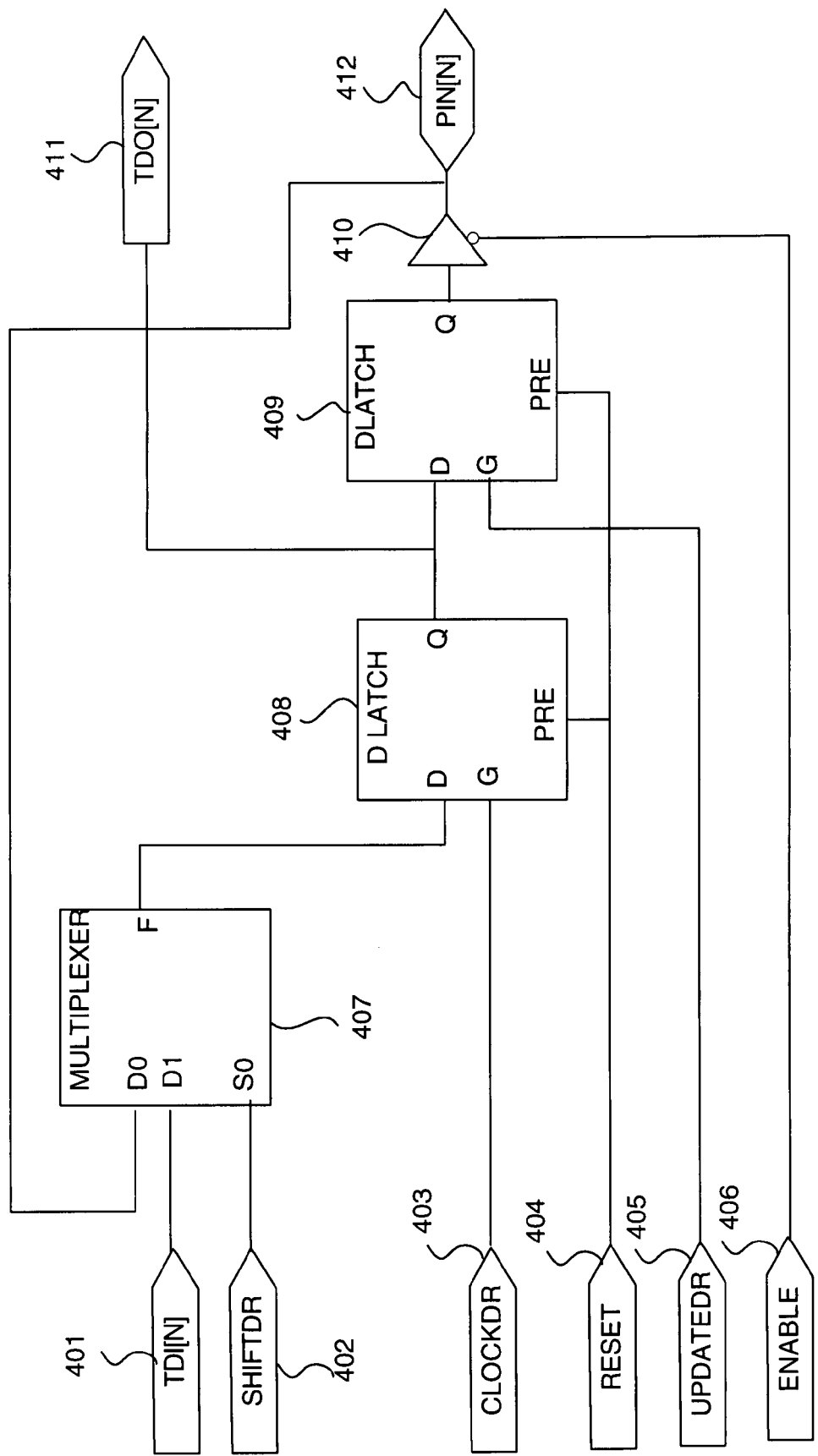
FIG. 4 is a block diagram illustrating a simplified cell with an output driver in accordance with at least one embodiment.

FIG. 4 is a block diagram illustrating a simplified cell with an output driver in accordance with at least one embodiment. The simplified cell with the output driver comprises multiplexer 407, D latch 408, D latch 409, and tri-state output driver 410. Multiplexer 407 receives input TDI[N] 401 at data input D1 and input SHIFTDR 402 at selection input S0. Multiplexer 407 receives an input from the output of tri-state output driver 410 at data input D0. Multiplexer 407 selects between a value present at data input D0 and a value present at data input D1 based on selection input S0 and provides the selected value at data output F, which is coupled to data input D of D latch 408. D latch 408 receives input CLOCKDR 403 at clock input G. D latch 408 and D latch 409 receive input RESET 404 at their respective preload inputs. D latch 409 receives clock input UPDATEDR 405 at clock input G. Data output Q of D latch 408 is coupled to data input D of D latch 409 and test data output TDO[N] 411. Data output Q of D latch 409 is coupled to an input of tri-state output driver 410. Tri-state output driver 410 receives input ENABLE 406 at its tri-state control input. Tri-state output driver 410 provides its output to data input D0 of multiplexer 407, as stated above, and to output PIN[N] 412.

The simplified cell with an output driver of FIG. 4 may be implemented in accordance with the following PLD specification:

```
-- Component Declaration for BSR_BC10
-- Self-monitoring Output Cell that does not support INTEST
entity BSR_BC10 is
port (
    TDI      : in std_logic;
    TDO      : inout std_logic;
    ShiftDR  : in std_logic;
    ClockDR  : in std_logic;
    UpdateDR : in std_logic;
    Reset    : in std_logic;
    Enable   : in std_logic;
    Pin      : inout std_logic
    );
end BSR_BC10;
begin
    -- Component Instantiation for MUX
    MUX : m2_1
    port map (
        D0  => Pin,
        D1  => TDI,
        S0  => ShiftDR,
        F   => dataMux
        );
    -- Component Instantiation for Shift Register
    SR : BSR_Dff
```

-continued

```
port map (
    D   => dataMux,
    G   => ClockDR,
    PRE => Reset,
    Q   => TDO
    );
-- Component Instantiation for Update Register
-- register updated on rising edge of UpdateDR
UR : BSR_Dff
port map (
    D   => TDO,
    G   => UpdateDR,
    PRE => Reset,
    Q   => dataPin
    );
    Pin <= dataPin when Enable='1' else 'Z';
end Structural;
-- Component Declaration for m2_1
-- 2-to-1 Multiplexer
entity m2_1 is
port (
    D0 : in std_logic;
    D1 : in std_logic;
    S0 : in std_logic;
    F  : out std_logic
    );
end m2_1;
architecture Behavioral of m2_1 is
begin
    process (D0,D1,S0)
        begin
            case S0 is
                when '0' => F <= D0;
                when '1' => F <= D1;
                when others => NULL;
            end case;
        end process;
end Behavioral;
-- Component Declaration for BSR_Dff
-- Transparent Data Latch with Asychronous Preset
entity BSR_Dff is
port (
    D   : in std_logic;
    G   : in std_logic;
    PRE : in std_logic;
    Q   : out std_logic
    );
end BSR_Dff;
architecture Behavioral of BSR_Dff is
begin
    process (PRE, G)
        begin
            if (PRE='1') then
                Q <= '1' after 2 ns;
            elsif (G'event and G='1') then    -- latches data on
                                                 rising edge
                Q <= D after 2 ns;
            end if;
        end process;
end Behavioral;
```

FIG. 5 is a block diagram illustrating a boundary scan register for an address bus in accordance with at least one embodiment. Boundary scan register 507 receives test data input TDI[30:12] 501 at its TDI. Boundary scan register 507 receives reset input RESET 502 at its reset input. Boundary scan register 507 receives clock input CLOCKDR 503 at its clock input CLOCKDR. Boundary scan register 507 receives input SHIFTDR 504 at its input SHIFTDR. Boundary scan register 507 receives clock input UPDATEDR 505 at its input UPDATEDR. Boundary scan register 507 receives input EXTEST 506 at its input ENABLE. Boundary scan register 507 provides test data output TDI[29:11] 508 from its TDO. Boundary scan register 507 provides address bus ADDR[18:0] 509 via bidirectional input/output PIN.

FIG. 6 is a block diagram illustrating a boundary scan register for a data bus in accordance with at least one embodiment. Boundary scan register 607 receives test data input TDI[11:4] 601 at its TDI. Boundary scan register 607 receives reset input RESET 602 at its reset input. Boundary scan register 607 receives clock input CLOCKDR 603 at its clock input CLOCKDR. Boundary scan register 607 receives input SHIFTDR 604 at its input SHIFTDR. Boundary scan register 607 receives clock input UPDATEDR 605 at its input UPDATEDR. Boundary scan register 607 receives input ENDATAQUAL 606 at its input ENABLE. Boundary scan register 607 provides test data output TDI[10:3] 608 from its TDO. Boundary scan register 607 provides data bus DATA[7:0] 609 via bidirectional input/output PIN.

Figure 7:
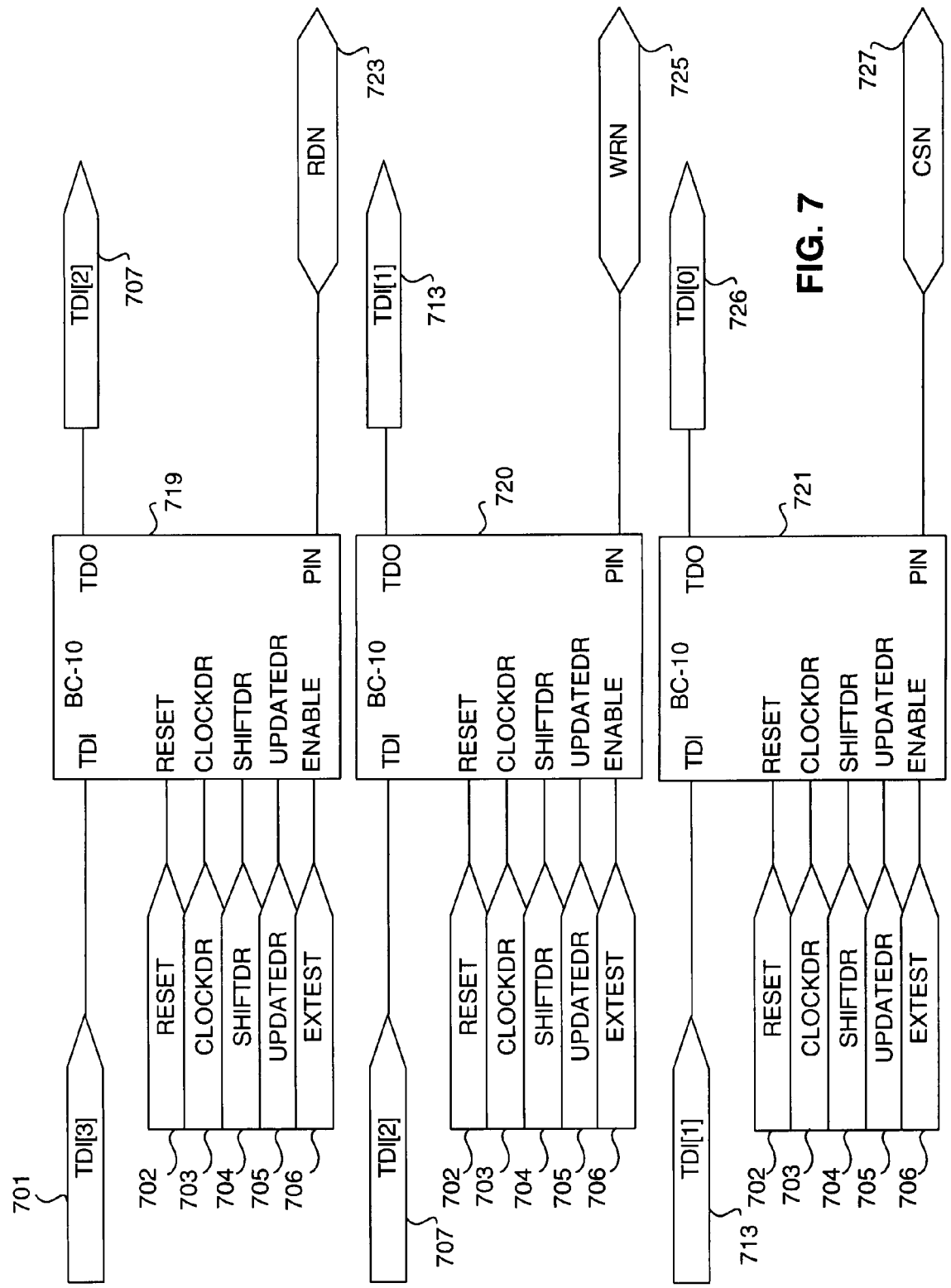
FIG. 7 is a block diagram illustrating a boundary scan register for control lines in accordance with at least one embodiment.

FIG. 7 is a block diagram illustrating a boundary scan register for control lines in accordance with at least one embodiment. Boundary scan register 719 receives test data input TDI[3] 701 at its TDI. Boundary scan register 719 receives reset input RESET 702 at its reset input. Boundary scan register 719 receives clock input CLOCKDR 703 at its clock input CLOCKDR. Boundary scan register 719 receives input SHIFTDR 704 at its input SHIFTDR. Boundary scan register 719 receives clock input UPDATEDR 705 at its input UPDATEDR. Boundary scan register 719 receives input EXTEST 706 at its input ENABLE. Boundary scan register 719 provides test data output TDI[2] 707 from its TDO. Boundary scan register 719 provides control output RDN 723 via bidirectional input/output PIN.

Boundary scan register 720 receives test data input TDI[2] 707 at its TDI. Boundary scan register 720 receives reset input RESET 702 at its reset input. Boundary scan register 720 receives clock input CLOCKDR 703 at its clock input CLOCKDR. Boundary scan register 720 receives input SHIFTDR 704 at its input SHIFTDR. Boundary scan register 720 receives clock input UPDATEDR 705 at its input UPDATEDR. Boundary scan register 720 receives input EXTEST 706 at its input ENABLE. Boundary scan register 720 provides test data output TDI[1] 713 from its TDO. Boundary scan register 720 provides control output WRN 725 via bidirectional input/output PIN.

Boundary scan register 721 receives test data input TDI[1] 713 at its TDI. Boundary scan register 721 receives reset input RESET 702 at its reset input. Boundary scan register 721 receives clock input CLOCKDR 703 at its clock input CLOCKDR. Boundary scan register 721 receives input SHIFTDR 704 at its input SHIFTDR. Boundary scan register 721 receives clock input UPDATEDR 705 at its input UPDATEDR. Boundary scan register 721 receives input EXTEST 706 at its input ENABLE. Boundary scan register 721 provides test data output TDI[0] 726 from its TDO. Boundary scan register 721 provides control output CSN 727 via bidirectional input/output PIN.

Figure 8:
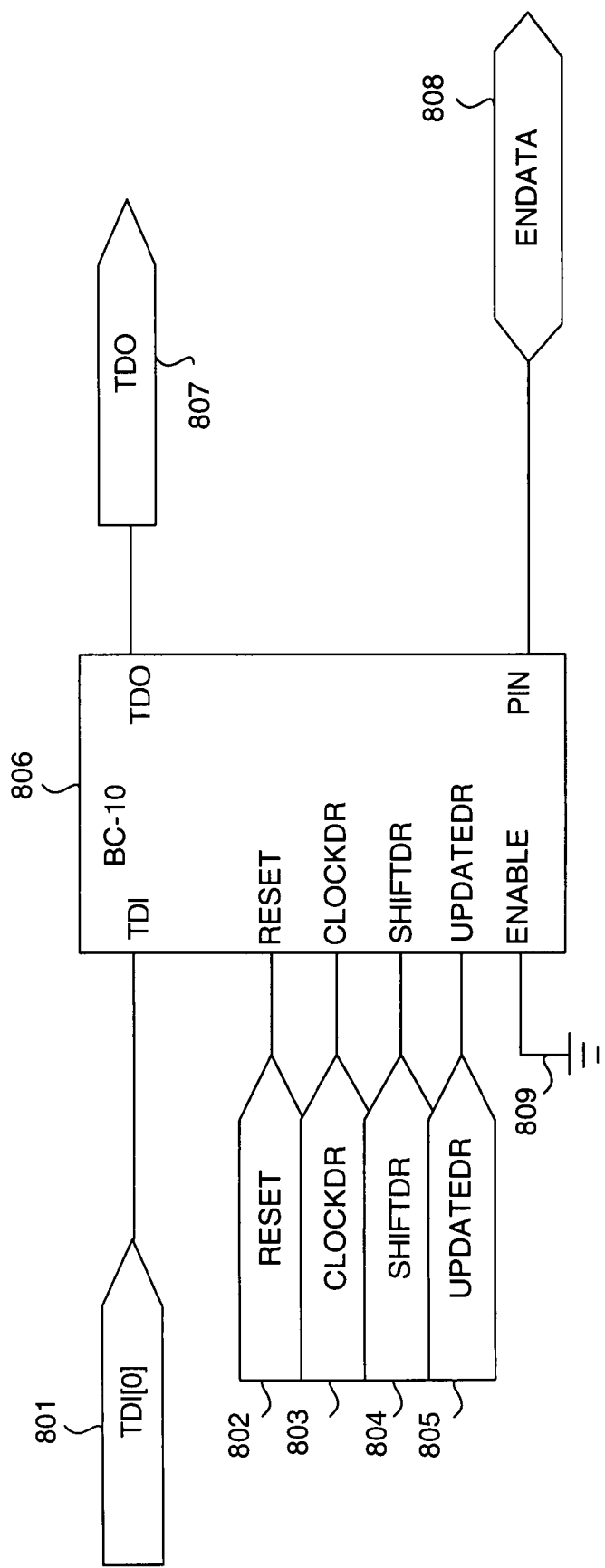
FIG. 8 is a block diagram illustrating a boundary scan register for a data bus enable line in accordance with at least one embodiment.

FIG. 8 is a block diagram illustrating a boundary scan register for a data bus enable line in accordance with at least one embodiment. Boundary scan register 806 receives test data input TDI[0] 801 at its TDI. Boundary scan register 806 receives reset input RESET 802 at its reset input. Boundary scan register 806 receives clock input CLOCKDR 803 at its clock input CLOCKDR. Boundary scan register 806 receives input SHIFTDR 804 at its input SHIFTDR. Boundary scan register 806 receives clock input UPDATEDR 805 at its input UPDATEDR. Boundary scan register 806 receives at its input ENABLE a fixed value (e.g., a logical zero value with the input ENABLE being grounded). Boundary scan register 806 provides test data output TDO 807 from its TDO. Boundary scan register 806 provides data bus output control ENDATA 808 via bidirectional input/output PIN.

Boundary scan registers such as those illustrated in FIGS. 5 through 8 may be implemented in accordance with the following PLD specification:

```
-- Component Declaration for BSR_BC10
component BSR_BC10 is
port (
    TDI       : in std_logic;
    TDO       : out std_logic;
    ShiftDR   : in std_logic;
    ClockDR   : in std_logic;
    UpdateDR  : in std_logic;
    Reset     : in std_logic;
    Enable    : in std_logic;
    Pin       : inout std_logic
    );
end component;
-- Instantiate 31 SR_BC10 components to create the boundary
register
Bsr_0: BSR_BC10 port map (
    TDI       => Tdi(0),
    TDO       => Tdo,
    ShiftDR   => ShiftDR,
    ClockDR   => ClkDR,
    UpdateDR  => UpdateDR,
    Reset     => Reset,
    Enable    => '1',
    Pin       => EnData
    );
Bsr_1: BSR_BC10 port map (
    TDI       => Tdi(1),
    TDO       => Tdi(0),
    ShiftDR   => ShiftDR,
    ClockDR   => ClkDR,
    UpdateDR  => UpdateDR,
    Reset     => Reset,
    Enable    => Extest,
    Pin       => CSn
    );
Bsr_2: BSR_BC10 port map (
    TDI       => Tdi(2),
    TDO       => Tdi(1),
    ShiftDR   => ShiftDR,
    ClockDR   => ClkDR,
    UpdateDR  => UpdateDR,
    Reset     => Reset,
    Enable    => Extest,
    Pin       => WRn
    );
Bsr_3: BSR_BC10 port map (
    TDI       => Tdi(3),
    TDO       => Tdi(2),
    ShiftDR   => ShiftDR,
    ClockDR   => ClkDR,
    UpdateDR  => UpdateDR,
    Reset     => Reset,
    Enable    => Extest,
    Pin       => RDn
    );
Bsr_4: BSR_BC10 port map (
    TDI       => Tdi(4),
    TDO       => Tdi(3),
    ShiftDR   => ShiftDR,
    ClockDR   => ClkDR,
    UpdateDR  => UpdateDR,
    Reset     => Reset,
    Enable    => EnDataQual,
    Pin       => DATA(0)
    );
Bsr_5: BSR_BC10 port map (
    TDI       => Tdi(5),
    TDO       => Tdi(4),
    ShiftDR   => ShiftDR,
    ClockDR   => ClkDR,
    UpdateDR  => UpdateDR,
    Reset     => Reset,
    Enable    => EnDataQual,
    Pin       => DATA(1)
    );
Bsr_6: BSR_BC10 port map (
    TDI       => Tdi(6),
    TDO       => Tdi(5),
    ShiftDR   => ShiftDR,
    ClockDR   => ClkDR,
    UpdateDR  => UpdateDR,
    Reset     => Reset,
    Enable    => EnDataQual,
    Pin       => DATA(2)
    );
Bsr_7: BSR_BC10 port map (
    TDI       => Tdi(7),
    TDO       => Tdi(6),
    ShiftDR   => ShiftDR,
    ClockDR   => ClkDR,
    UpdateDR  => UpdateDR,
    Reset     => Reset,
    Enable    => EnDataQual,
    Pin       => DATA(3)
    );
Bsr_8: BSR_BC10 port map (
    TDI       => Tdi(8),
    TDO       => Tdi(7),
    ShiftDR   => ShiftDR,
    ClockDR   => ClkDR,
    UpdateDR  => UpdateDR,
    Reset     => Reset,
    Enable    => EnDataQual,
    Pin       => DATA(4)
    );
Bsr_9: BSR_BC10 port map (
    TDI       => Tdi(9),
    TDO       => Tdi(8),
    ShiftDR   => ShiftDR,
    ClockDR   => ClkDR,
    UpdateDR  => UpdateDR,
    Reset     => Reset,
    Enable    => EnDataQual,
    Pin       => DATA(5)
    );
Bsr_10: BSR_BC10 port map (
    TDI       => Tdi(10),
    TDO       => Tdi(9),
    ShiftDR   => ShiftDR,
    ClockDR   => ClkDR,
    UpdateDR  => UpdateDR,
    Reset     => Reset,
    Enable    => EnDataQual,
    Pin       => DATA(6)
    );
Bsr_11: BSR_BC10 port map (
    TDI       => Tdi(11),
    TDO       => Tdi(10),
    ShiftDR   => ShiftDR,
    ClockDR   => ClkDR,
    UpdateDR  => UpdateDR,
    Reset     => Reset,
    Enable    => EnDataQual,
    Pin       => DATA(7)
    );
Bsr_12: BSR_BC10 port map (
    TDI       => Tdi(12),
    TDO       => Tdi(11),
    ShiftDR   => ShiftDR,
    ClockDR   => ClkDR,
    UpdateDR  => UpdateDR,
    Reset     => Reset,
    Enable    => Extest,
    Pin       => ADDR(0)
    );
Bsr_13: BSR_BC10 port map (
    TDI       => Tdi(13),
    TDO       => Tdi(12),
    ShiftDR   => ShiftDR,
    ClockDR   => ClkDR,
    UpdateDR  => UpdateDR,
    Reset     => Reset,
    Enable    => Extest,
    Pin       => ADDR(1)
```

-continued

```
    );
Bsr_14: BSR_BC10 port map (
    TDI         => Tdi(14),
    TDO         => Tdi(13),
    ShiftDR     => ShiftDR,
    ClockDR     => ClkDR,
    UpdateDR    => UpdateDR,
    Reset       => Reset,
    Enable      => Extest,
    Pin         => ADDR(2)
    );
Bsr_15: BSR_BC10 port map (
    TDI         => Tdi(15),
    TDO         => Tdi(14),
    ShiftDR     => ShiftDR,
    ClockDR     => ClkDR,
    UpdateDR    => UpdateDR,
    Reset       => Reset,
    Enable      => Extest,
    Pin         => ADDR(3)
    );
Bsr_16: BSR_BC10 port map (
    TDI         => Tdi(16),
    TDO         => Tdi(15),
    ShiftDR     => ShiftDR,
    ClockDR     => ClkDR,
    UpdateDR    => UpdateDR,
    Reset       => Reset,
    Enable      => Extest,
    Pin         => ADDR(4)
    );
Bsr_17: BSR_BC10 port map (
    TDI         => Tdi(17),
    TDO         => Tdi(16),
    ShiftDR     => ShiftDR,
    ClockDR     => ClkDR,
    UpdateDR    => UpdateDR,
    Reset       => Reset,
    Enable      => Extest,
    Pin         => ADDR(5)
    );
Bsr_18: BSR_BC10 port map (
    TDI         => Tdi(18),
    TDO         => Tdi(17),
    ShiftDR     => ShiftDR,
    ClockDR     => ClkDR,
    UpdateDR    => UpdateDR,
    Reset       => Reset,
    Enable      => Extest,
    Pin         => ADDR(6)
    );
Bsr_19: BSR_BC10 port map (
    TDI         => Tdi(19),
    TDO         => Tdi(18),
    ShiftDR     => ShiftDR,
    ClockDR     => ClkDR,
    UpdateDR    => UpdateDR,
    Reset       => Reset,
    Enable      => Extest,
    Pin         => ADDR(7)
    );
Bsr_20: BSR_BC10 port map (
    TDI         => Tdi(20),
    TDO         => Tdi(19),
    ShiftDR     => ShiftDR,
    ClockDR     => ClkDR,
    UpdateDR    => UpdateDR,
    Reset       => Reset,
    Enable      => Extest,
    Pin         => ADDR(8)
    );
Bsr_21: BSR_BC10 port map (
    TDI         => Tdi(21),
    TDO         => Tdi(20),
    ShiftDR     => ShiftDR,
    ClockDR     => ClkDR,
    UpdateDR    => UpdateDR,
    Reset       => Reset,
    Enable      => Extest,
    Pin         => ADDR(9)
    );
Bsr_22: BSR_BC10 port map (
    TDI         => Tdi(22),
    TDO         => Tdi(21),
    ShiftDR     => ShiftDR,
    ClockDR     => ClkDR,
    UpdateDR    => UpdateDR,
    Reset       => Reset,
    Enable      => Extest,
    Pin         => ADDR(10)
    );
Bsr_23: BSR_BC10 port map (
    TDI         => Tdi(23),
    TDO         => Tdi(22),
    ShiftDR     => ShiftDR,
    ClockDR     => ClkDR,
    UpdateDR    => UpdateDR,
    Reset       => Reset,
    Enable      => Extest,
    Pin         => ADDR(11)
    );
Bsr_24: BSR_BC10 port map (
    TDI         => Tdi(24),
    TDO         => Tdi(23),
    ShiftDR     => ShiftDR,
    ClockDR     => ClkDR,
    UpdateDR    => UpdateDR,
    Reset       => Reset,
    Enable      => Extest,
    Pin         => ADDR(12)
    );
Bsr_25: BSR_BC10 port map (
    TDI         => Tdi(25),
    TDO         => Tdi(24),
    ShiftDR     => ShiftDR,
    ClockDR     => ClkDR,
    UpdateDR    => UpdateDR,
    Reset       => Reset,
    Enable      => Extest,
    Pin         => ADDR(13)
    );
Bsr_26: BSR_BC10 port map (
    TDI         => Tdi(26),
    TDO         => Tdi(25),
    ShiftDR     => ShiftDR,
    ClockDR     => ClkDR,
    UpdateDR    => UpdateDR,
    Reset       => Reset,
    Enable      => Extest,
    Pin         => ADDR(14)
    );
Bsr_27: BSR_BC10 port map (
    TDI         => Tdi(27),
    TDO         => Tdi(26),
    ShiftDR     => ShiftDR,
    ClockDR     => ClkDR,
    UpdateDR    => UpdateDR,
    Reset       => Reset,
    Enable      => Extest,
    Pin         => ADDR(15)
    );
Bsr_28: BSR_BC10 port map (
    TDI         => Tdi(28),
    TDO         => Tdi(27),
    ShiftDR     => ShiftDR,
    ClockDR     => ClkDR,
    UpdateDR    => UpdateDR,
    Reset       => Reset,
    Enable      => Extest,
    Pin         => ADDR(16)
    );
Bsr_29: BSR_BC10 port map (
    TDI         => Tdi(29),
    TDO         => Tdi(28),
    ShiftDR     => ShiftDR,
    ClockDR     => ClkDR,
    UpdateDR    => UpdateDR,
    Reset       => Reset,
```

-continued

```
        Enable      => Extest,
        Pin         => ADDR(17)
        );
    Bsr_30: BSR_BC10 port map (
        TDI         => Tdi(30),
        TDO         => Tdi(29),
        ShiftDR     => ShiftDR,
        ClockDR     => ClkDR,
        UpdateDR    => UpdateDR,
        Reset       => Reset,
        Enable      => Extest,
        Pin         => ADDR(18)
        );
```

The following BSDL file may be used to implement at least one embodiment:

```
entity IOMFlash is
generic (PHYSICAL_PIN_MAP : string := "FF896" );
port (
    TCK:  in bit;
    TDI:  in bit;
    TDO:  out bit;
    TMS:  in bit;
    ADDR: inout bit_vector (18 to 0);
    DATA: inout bit_vector (7 to 0);
    RDn:  inout bit;
    WRn:  inout bit;
    CSn:  inout bit
);
attribute PIN_MAP of IOMFlash : entity is PHYSICAL_PIN_MAP
constant PSEUDO_DEVICE: PIN_MAP_STRING:=
    "TCK:D5," &
    "TDI:A29," &
    "TDO:B3," &
    "TMS:C4," &
    "ADDR:(AE10, AE9, AK5, AK6, AF8, AF7, AD11, AD10, AJ6,
        AK7, AG7," &
        "AF9, AH6, AH5, AC11, AC10, AK4, AJ4, AG6),"  &  --
        ADDR[18:0]
    "DATA:(AG8, AE12, AE11, AJ7, AJ8, AG10, AG9, AH9)," & --
        DATA[7:0]
    "RDn:AK9," &          -- CTRL_RD_N
    "WRn:AF10," &         -- CTRL_WR_N
    "CSn:AF11";           -- BOOT0_CS_N
attribute INSTRUCTION_OPCODE of IOMFlash : entity is
    -- "EXTEST    (000000)," &
    -- "SAMPLE    (000001)," &
    "EXTEST    (000010)," & -- USER1 re-defined to be
                                         EXTEST
    "SAMPLE    (000011)," & -- USER2 re-defined to be
                                         SAMPLE/PRELOAD
    "PRELOAD   (000011)," & -- USER2 re-defined to be
                                         SAMPLE/PRELOAD
attribute BOUNDARY_LENGTH of IOMFlash : entity is 32;
attribute BOUNDARY_REGISTER of IOMFlash : entity is
-- cellnum (type, port, function, safe[, ccell, disval,
disrslt])
    " 0 (BC_10, *, controlr, 1)," &
    " 1 (BC_10, CSn, output2, 1)," &
    " 2 (BC_10, WRn, output2, 1)," &
    " 3 (BC_10, RDn, output2, 1)," &
    " 4 (BC_10, DATA(0), output3, X, 0, 1, Z)," &
    " 5 (BC_10, DATA(1), output3, X, 0, 1, Z)," &
    " 6 (BC_10, DATA(2), output3, X, 0, 1, Z)," &
    " 7 (BC_10, DATA(3), output3, X, 0, 1, Z)," &
    " 8 (BC_10, DATA(4), output3, X, 0, 1, Z)," &
    " 9 (BC_10, DATA(5), output3, X, 0, 1, Z)," &
    " 10 (BC_10, DATA(6), output3, X, 0, 1, Z)," &
    " 11 (BC_10, DATA(7), output3, X, 0, 1, Z)," &
    " 12 (BC_10, ADDR(0), output2, 1)," &
    " 13 (BC_10, ADDR(1), output2, 1)," &
    " 14 (BC_10, ADDR(2), output2, 1)," &
    " 15 (BC_10, ADDR(3), output2, 1)," &
    " 16 (BC_10, ADDR(4), output2, 1)," &
    " 17 (BC_10, ADDR(5), output2, 1)," &
    " 18 (BC_10, ADDR(6), output2, 1)," &
    " 19 (BC_10, ADDR(7), output2, 1)," &
    " 20 (BC_10, ADDR(8), output2, 1)," &
    " 21 (BC_10, ADDR(9), output2, 1)," &
    " 22 (BC_10, ADDR(10), output2, 1)," &
    " 23 (BC_10, ADDR(11), output2, 1)," &
    " 24 (BC_10, ADDR(12), output2, 1)," &
    " 25 (BC_10, ADDR(13), output2, 1)," &
    " 26 (BC_10, ADDR(14), output2, 1)," &
    " 27 (BC_10, ADDR(15), output2, 1)," &
    " 28 (BC_10, ADDR(16), output2, 1)," &
    " 29 (BC_10, ADDR(17), output2, 1)," &
    " 30 (BC_10, ADDR(18), output2, 1),";
end IOMFlash;
```

Figure 9:
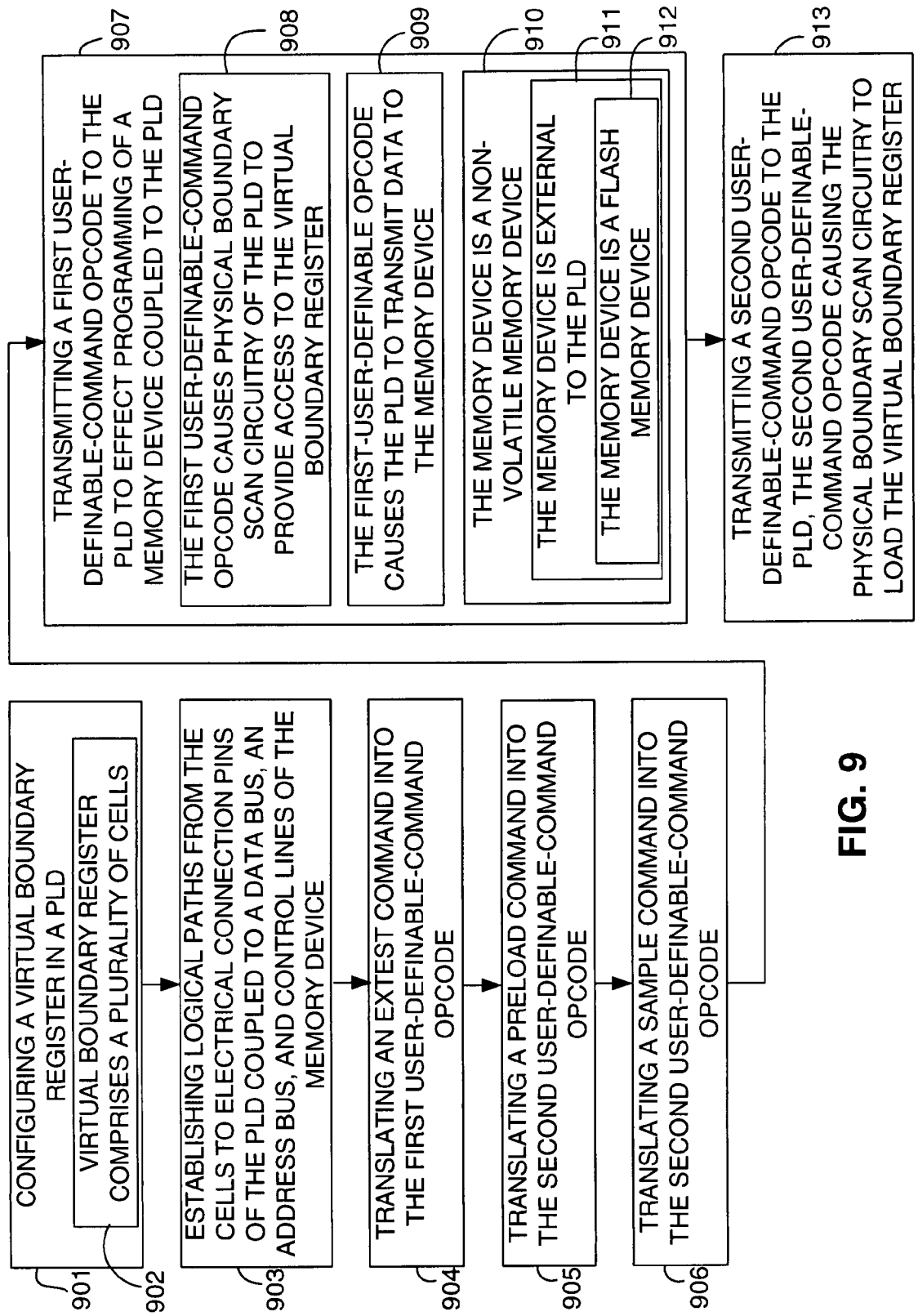
FIG. 9 is a flow diagram illustrating a method in accordance with at least one embodiment.

FIG. 9 is a flow diagram illustrating a method in accordance with at least one embodiment. In step 901, a virtual boundary register is configured in a programmable logic device (PLD). Step 901 may comprise step 902. In step 902, the configuring the virtual boundary register in the PLD further comprises configuring a virtual boundary register comprising a plurality of cells.

From step 901, the method continues to step 903. Step 903 comprise establishing logical paths from the cells to electrical connection pins of the PLD coupled to a data bus, an address bus, and control lines of the memory device. From step 903, the method continues to step 904. Step 904 comprises translating an EXTEST command into the first user-definable-command opcode. From step 904, the method continues to step 905. Step 905 comprises translating a PRELOAD command into the second user-definable-command opcode. From step 905, the method continues to step 906. Step 906 comprises translating a SAMPLE command into the second user-definable-command opcode.

From step 906, the method continues to step 907. Step 907 comprises transmitting a first user-definable-command operation code (opcode) to the PLD to effect programming of a memory device coupled to the PLD. Step 907 may comprise steps 908, 909, and/or 910. Step 908 comprises transmitting the first user-definable-command opcode wherein the first user-definable-command opcode causes physical boundary scan circuitry of the PLD to provide access to the virtual boundary register. Step 909 comprises transmitting the first user-definable-command opcode wherein the first user-definable-command opcode causes the PLD to transmit data to the memory device. Step 910 comprises transmitting the first user-definable-command opcode wherein the memory device is a non-volatile memory device. Step 910 may comprise step 911. Step 911 comprises transmitting the first user-definable-command opcode wherein the memory device is external to the PLD. Step 911 may comprise step 912. Step 912 comprises transmitting the first user-definable-command opcode wherein the memory device is a flash memory device.

From step 907, the method continues to step 913. Step 913 comprises transmitting a second user-definable-command opcode to the PLD, the second user-definable-command opcode causing the physical boundary scan circuitry to load the virtual boundary register.

Figure 10:
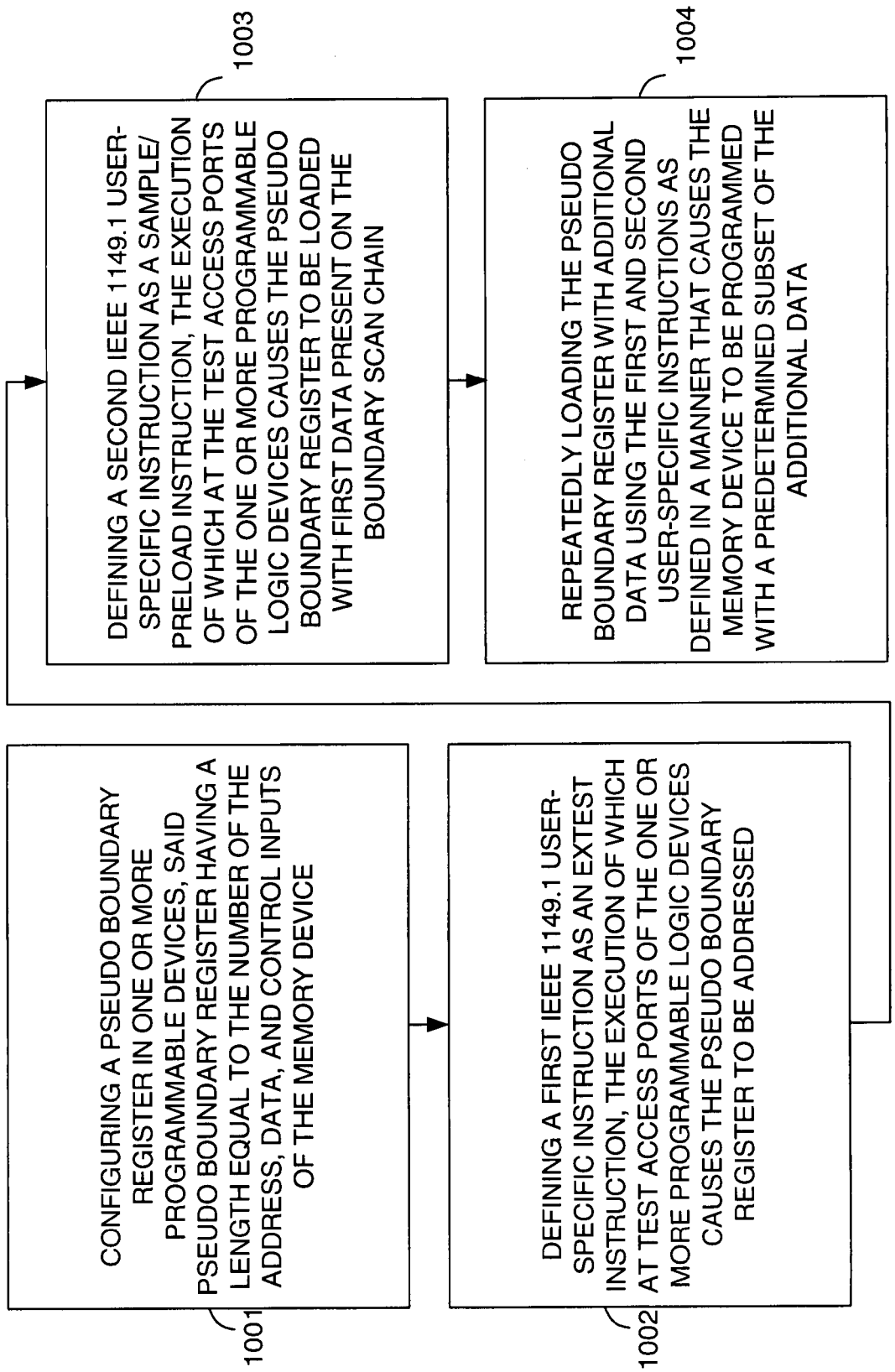
FIG. 10 is a flow diagram illustrating a method in accordance with at least one embodiment.

FIG. 10 is a flow diagram illustrating a method in accordance with at least one embodiment. The method may be, for example, a method for programming a memory device (e.g., a flash memory device) having address, data, and control inputs cumulatively coupled to outputs of at least one programmable logic device that comprises a boundary scan circuit coupled to form a boundary scan chain. The method comprises steps 1001, 1002, 1003, and 1004. Step 1001 comprises configuring a pseudo boundary register in the at least one programmable device, said pseudo boundary register having a length of at least (and preferably equal to) the number of the address, data and control inputs of the memory device. From step 1001, the method continues at step 1002. Step 1002 comprises defining a first IEEE 1149.1 user-specific instruction as an EXTEST instruction, wherein issuance of the first IEEE 1149.1 user-specific instruction to at least one test access port of the at least one programmable logic device causes the pseudo boundary register to be addressed. From step 1002, the method continues at step 1003. Step 1003 comprises defining a second IEEE 1149.1 user-specific instruction as a SAMPLE/PRELOAD instruction, wherein the issuance of the second IEEE 1149.1 user-specific instruction to the at least one test access port of the at least one programmable logic device causes the pseudo boundary register to be loaded with first data present on the boundary scan chain. From step 1003, the method continues at step 1004. Step 1004 comprises repeatedly loading the pseudo boundary register with additional data using the first IEEE 1149.1 user-specific instruction as defined in a manner that causes the memory device to be programmed with a predetermined subset of the additional data. (e.g., some bits of the pseudo register are used as address and control lines to the flash device, while the remainder are written to the memory device as a data word).

Accordingly, a method and apparatus for boundary scan programming of memory devices is described. It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An article of manufacture comprising:
    a first memory device adapted to be read by a processing module, wherein the first memory device stores operating instructions for causing the processing module to perform:
    configuring a virtual boundary register in a programmable logic device (PLD); and
    transmitting a first user-definable-command operation code (opcode) to the PLD to effect programming of a second memory device coupled to the PLD;
    wherein the operating instructions further comprise operating instructions for causing the processing module to perform:
    establishing logical paths from a plurality of cells of the virtual boundary register to electrical connection pins of the PLD coupled to a data bus, an address bus, and control lines of the second memory device.

2. The article of manufacture of claim 1 wherein the operating instructions further comprise operating instructions for causing the processing module to perform:
    using the first user-definable-command opcode to cause physical boundary scan circuitry of the PLD to provide access to the virtual boundary register.

3. The article of manufacture of claim 1 wherein the operating instructions further comprise operating instructions for causing the processing module to perform:
    transmitting a second user-definable-command opcode to the PLD, the second user-definable-command opcode causing the physical boundary scan circuitry to load the virtual boundary register.

4. The article of manufacture of claim 1 wherein the operating instructions further comprise operating instructions for causing the processing module to perform:
    using the first user-definable-command opcode to cause the PLD to transmit data to the second memory device.

5. The article of manufacture of claim 1 wherein the operating instructions further comprise operating instructions for causing the processing module to perform:
    translating an EXTEST command into the first user-definable-command opcode.

6. The article of manufacture of claim 5 wherein the operating instructions further comprise operating instructions for causing the processing module to perform:
    translating a PRELOAD command into the second user-definable-command opcode.

7. The article of manufacture of claim 6 wherein the operating instructions further comprise operating instructions for causing the processing module to perform:
    translating a SAMPLE command into the second user-definable-command opcode.

8. The article of manufacture of claim 1 wherein the second memory device is a non-volatile memory device.

9. The article of manufacture of claim 8 wherein the second memory device is external to the PLD.

10. The article of manufacture of claim 9 wherein the second memory device is a flash memory device.

11. An article of manufacture comprising:
    a first memory device adapted to be read by a processing module, wherein the first memory device stores operating instructions for causing the processing module to perform:
    configuring a virtual boundary register in a core logic of a programmable logic device (PLD); and
    transmitting a first user-definable-command operation code (opcode) to the PLD to effect programming of a second memory device coupled to the PLD;
    wherein the operating instructions further comprise operating instructions for causing the processing module to perform:
    using the first user-definable-command opcode to cause physical boundary scan circuitry of the PLD to provide access to the virtual boundary register.

12. The article of manufacture of claim 11 wherein the operating instructions further comprise operating instructions for causing the processing module to perform:
    establishing logical paths from a plurality of cells of the virtual boundary register to electrical connection pins of the PLD coupled to a data bus, an address bus, and control lines of the second memory device.

13. The article of manufacture of claim 11 wherein the operating instructions further comprise operating instructions for causing the processing module to perform:
    transmitting a second user-definable-command opcode to the PLD, the second user-definable-command opcode causing the physical boundary scan circuitry to load the virtual boundary register.

14. The article of manufacture of claim 11 wherein the operating instructions further comprise operating instructions for causing the processing module to perform:
    using the first user-definable-command opcode to cause the PLD to transmit data to the second memory device.

15. The article of manufacture of claim 11 wherein the operating instructions further comprise operating instructions for causing the processing module to perform:
   translating an EXTEST command into the first user-definable-command opcode.

16. The article of manufacture of claim 15 wherein the operating instructions further comprise operating instructions for causing the processing module to perform:
   translating a PRELOAD command into the second user-definable-command opcode.

17. The article of manufacture of claim 16 wherein the operating instructions further comprise operating instructions for causing the processing module to perform:
   translating a SAMPLE command into the second user-definable-command opcode.

18. The article of manufacture of claim 11 wherein the second memory device is a non-volatile memory device.

19. The article of manufacture of claim 18 wherein the second memory device is external to the PLD.

20. The article of manufacture of claim 19 wherein the second memory device is a flash memory device.

21. An article of manufacture comprising:
   a first memory device adapted to be read by a processing module, wherein the first memory device stores operating instructions for causing the processing module to perform:
   configuring a virtual boundary register in a core logic of a programmable logic device (PLD); and
   transmitting a first user-definable-command operation code (opcode) to the PLD to effect programming of a second memory device coupled to the PLD;
   wherein the operating instructions further comprise operating instructions for causing the processing module to perform:
   transmitting a second user-definable-command opcode to the PLD, the second user-definable-command opcode causing the physical boundary scan circuitry to load the virtual boundary register.

22. The article of manufacture of claim 21 wherein the operating instructions further comprise operating instructions for causing the processing module to perform:
   establishing logical paths from a plurality of cells of the virtual boundary register to electrical connection pins of the PLD coupled to a data bus, an address bus, and control lines of the second memory device.

23. The article of manufacture of claim 21 wherein the operating instructions further comprise operating instructions for causing the processing module to perform:
   using the first user-definable-command opcode to cause the PLD to transmit data to the second memory device.

24. The article of manufacture of claim 21 wherein the operating instructions further comprise operating instructions for causing the processing module to perform:
   translating an EXTEST command into the first user-definable-command opcode.

25. The article of manufacture of claim 24 wherein the operating instructions further comprise operating instructions for causing the processing module to perform:
   translating a PRELOAD command into the second user-definable-command opcode.

26. The article of manufacture of claim 25 wherein the operating instructions further comprise operating instructions for causing the processing module to perform:
   translating a SAMPLE command into the second user-definable-command opcode.

27. The article of manufacture of claim 21 wherein the second memory device is a non-volatile memory device.

28. The article of manufacture of claim 27 wherein the second memory device is external to the PLD.

29. The article of manufacture of claim 28 wherein the second memory device is a flash memory device.

* * * * *